United States Patent [19]

Fathi

[11] Patent Number: 4,656,559
[45] Date of Patent: Apr. 7, 1987

[54] HOLDER AND HEAT SINK FOR ELECTRONIC COMPONENTS

[75] Inventor: Saul S. Fathi, Huntington, N.Y.

[73] Assignee: Ultima Electronics Ltd., Farmingdale, N.Y.

[21] Appl. No.: 608,952

[22] Filed: May 10, 1984

[51] Int. Cl.[4] .............................................. H05K 7/20
[52] U.S. Cl. .................................. 361/386; 361/394; 361/415
[58] Field of Search .............. 361/380, 383, 385, 386, 361/388–391, 394, 395, 399

[56] References Cited

U.S. PATENT DOCUMENTS

| 3,364,395 | 1/1968 | Donofrio et al. | 361/388 |
| 3,997,819 | 12/1976 | Eggert et al. | 361/386 |
| 4,109,294 | 8/1978 | Mason et al. | 361/386 |

FOREIGN PATENT DOCUMENTS

| 2229173 | 6/1972 | Fed. Rep. of Germany | 361/380 |
| 2347902 | 9/1973 | Fed. Rep. of Germany | 361/380 |
| 2354260 | 10/1973 | Fed. Rep. of Germany | 361/385 |
| 2833043 | 7/1978 | Fed. Rep. of Germany | 361/386 |
| 2732139 | 1/1979 | Fed. Rep. of Germany | 361/429 |

Primary Examiner—A. D. Pellinen
Assistant Examiner—Gregory D. Thompson
Attorney, Agent, or Firm—Edward H. Loveman

[57] ABSTRACT

A heat sink housing for electronic components comprises a metal tube having four walls formed with internal and external ridges and grooves. The inside ridges and grooves removably support circuit boards and separate circuit members. The external ridges maximize radiation of heat from inside the tube. Two cover plates are removably attached to open ends of the tube to form a closed compartment in the tube.

6 Claims, 5 Drawing Figures

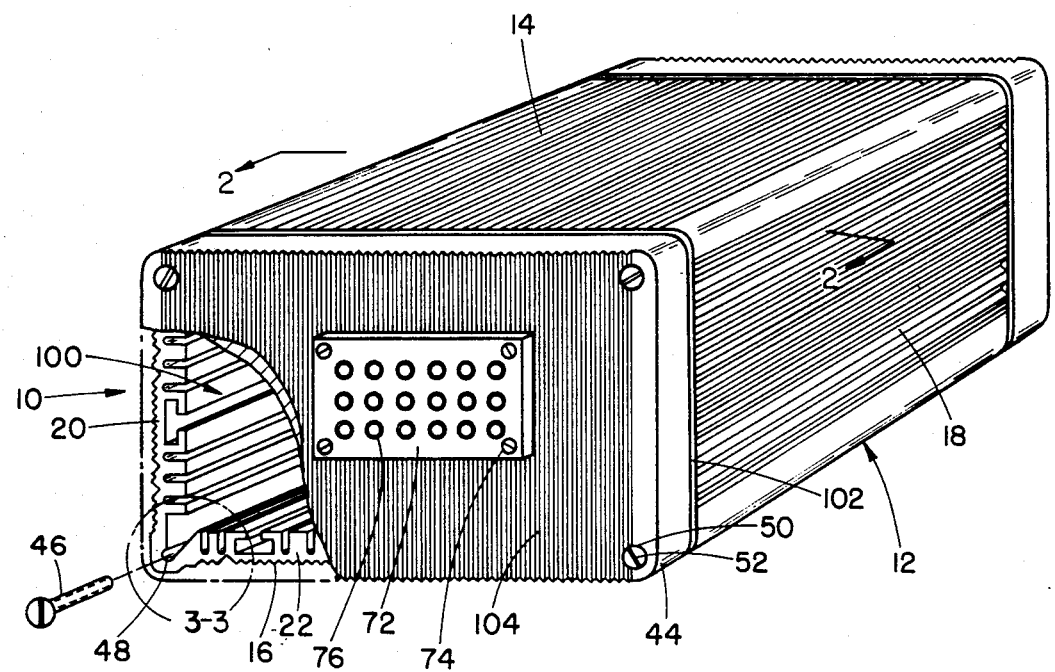
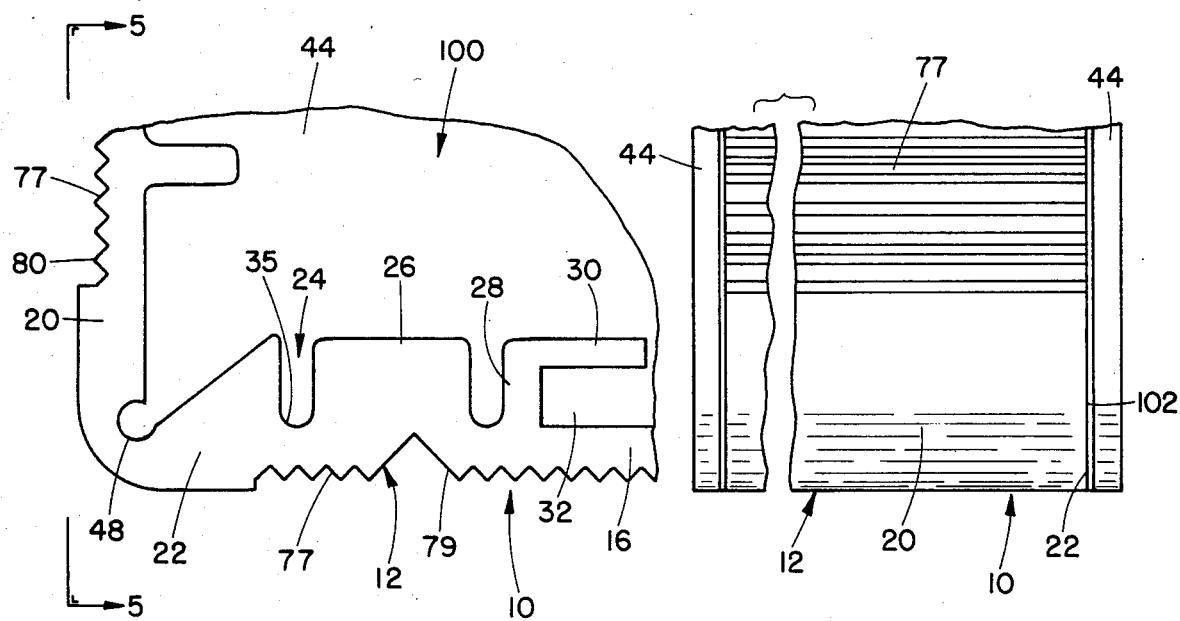
FIG.1
FIG.3
FIG.5

HOLDER AND HEAT SINK FOR ELECTRONIC COMPONENTS

BACKGROUND OF THE INVENTION

1. Field of the Invention

This invention concerns an improved holder and heat sink for electronic components.

Heretofore it has been conventional to mount electronic circuit boards on open racks. Generally the boards are screwed into place, which make assembly, time consuming and laborious. Difficulties are encountered with mounting electronic components such as triacs which are connected in a circuit on the board. In those installations the electronic boards are exposed to ambient air, dust, humidity, and other conditions which adversely affected the characteristics, performance, and useful lives of the circuit boards and associated components. Other objections to prior mounting means and holders include drilling and other secondary operations, high cost, multiplicity of parts, etc.

2. Summary of the Invention

The present invention is directed at overcoming the above and other difficulties and disadvantages of prior mounting means for electronic circuit boards and associated electronic components which require substantial heat sinks. According to the invention there is provided a one-piece metal tube formed on its inner opposing sides with grooves which slidably receive electronic or printed circuit boards. Opposite edges of the cicuit boards or plates engage in parallel grooves in opposing sides of the tube. Some grooves are formed to receive internally threaded nuts for screws which can secure auxiliary electronic components connected to the circuit boards and simultaneously be used as a heat sink for the components. Rectangular cover plates can be attached to ends of the tube which has corner grooves arranged to receive self-taping screws for the cover plates. The cover plates may carry connectors such as plugs or sockets by means of which external circuitry and power supplies may be connected to the circuit boards and associated components. The outer sides of the metal tube are formed with parallel grooves. The internal and external grooves define ridges and valleys which effectively serve as heat conductors and radiators so that the assembly operates as an efficient heat sink for the electronic circuits and associated components. Furthermore, the cover plates enclose the tube to define a closed compartment isolated from air, dust, humidity, radiation fields, and other ambient conditions which might otherwise adversely affect the operation of the electronic circuit and components inside the compartment. A particularly advantageous feature of the invention is the facility with which circuit boards and components may be inserted and removed from the holder. The holder is basically formed as a continuous tubular metal extrusion which may be cut into sections of any desired length. The tubular extrusion is preferably made of aluminum which is light in weight, relatively inexpensive, and has excellent heat conducting properties which may be further improved by plating the external compartment.

These and other objects any many of the attendant advantages of this invention will be readily appreciated as the same becomes better understood by reference to the following detailed description when considered in connection with the accompanying drawings in which:

BRIEF DESCRIPTION OF THE DRAWINGS

FIG. 1 is a perspective view of a holder assembly embodying the invention, with a portion of one end cover plate broken away;

FIG. 3 is a further enlarged end elevational view an end portion of the holder taken along circular line 3—3 of FIG. 1;

FIG. 5 is a fragmentary side elevational view taken on line 5—5 of FIG. 3.

DESCRIPTION OF THE PREFERRED EMBODIMENTS

Figure 2:
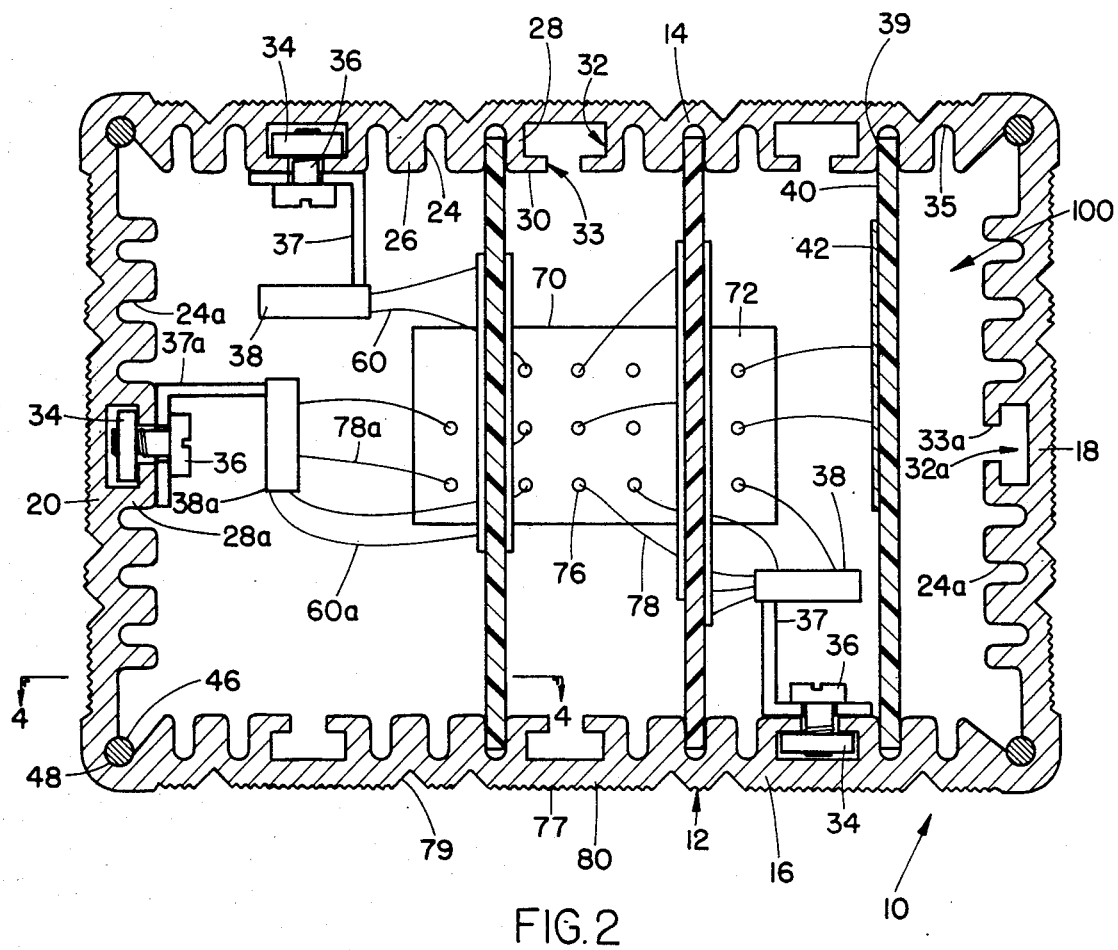
FIG. 2 is an enlarged cross sectional view taken along line 2—2 of FIG. 1.
Figure 4:
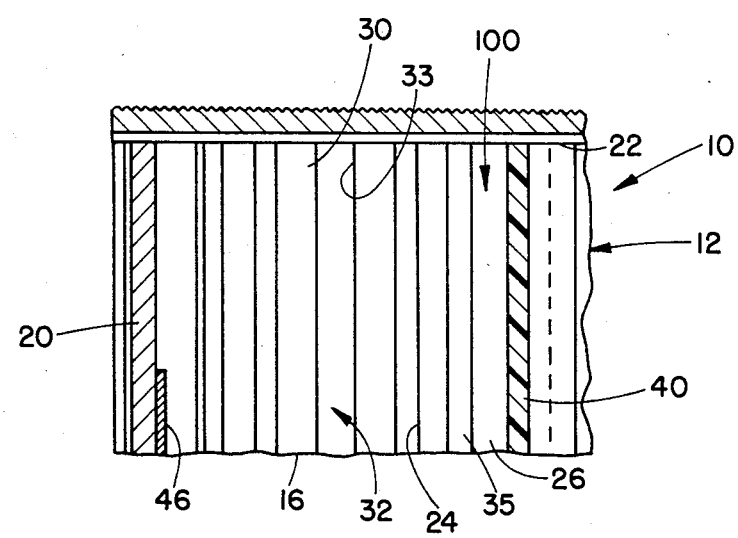
FIG. 4 is a fragmentary horizontal sectional view taken along line 4—4 of FIG. 2.

Referring now to the drawings wherein like reference characters designate like or corresponding parts throughout, there is illustrated in FIGS. 1-5, and electronic component holder assembly generally designated by reference numeral 10 embodying the invention. The assembly 10 comprises a rectangular shaped thermally conductive tube 12 having parallel opposed walls 14, 16 perpendicularly disposed to parallel opposed walls 18, 20. The tube 12 has flat faces 22 at opposite ends. The inner sides of the walls 14 and 16 are each formed with a multiplicity of grooves 24 defined by parallel ridges 26. Spaced pairs of ridges 28 have undercut flanges 30 defining a rectangular groove 32 for securing a threaded nut 34, with a lateral opening 33 through which a threaded screw 6 may be inserted to support an individual circuit member or component 38 such as a triad by inserting the screw 36 through a tab 37 from the component 38 and threading the screw 36 into the nut 34 whereby the component 38 is secured in the holder assembly 10 which acts as a heat sink for the component 38. The inner sides 35 of the grooves 24 are rounded. The grooves 24 and the ridges 26 on the wall 14 are aligned with corresponding grooves in the wall 16 to receive lateral edges 39 of a printed circuit board 40. The board 40 is slidably received in grooves 24 and is frictionally engaged at the ends 39 to prevent vibration of the circuit board. The circuit boards 40 may carry a printed electronic circuit or a circuit element 42. Similar parallel opposing grooves 24a may receive other circuit boards, when the circuit boards 40 are removed. Similarly, grooves 32a formed by ridges 28a may receive nuts 34a via opening 33a for engaging a screw 36 which will secure an individual circuit member 38a to the tube 12. The circuit boards depending on their width may be mounted between the more closely spaced wider walls 14, 16, as shown in FIG. 4, or between the more widely spaced narrower walls 18, 20, depending on the widths of the circuit boards. The boards 40 may have any lengths less than the length of the tube 12.

Cover plates 44 are attachable to opposite ends of the tube 12 by self-taping screws 46. These screws are threaded into cylindrical grooves 48 defined at inside corners of the tube 12 between adjacent walls 14, 18; 18, 16; 16, 20; and 20, 14; see FIGS. 1-4. The screws 46 are inserted through corner holdes 50 formed in the cover plates 44 and their heads 52 are engaged in the holes 50 which may be countersunk. Wire conductors 60, 60a are connected between the components 38 and the circuit elements 42 on the circuit boards 40.

The cover plates 44 may have openings 70 which receive connector blocks 72 held in place by screws 74.

These blocks may have pin jacks 76 which can be connected by wire conductors 78, 78a to the components 38 and the circuit elements 42 on the boards 40.

The outer sides of the walls 14, 16, 18, 20, are formed with a multiplicity of narrow grooves 77 and wider grooves 79 defined by V-shaped ridges 80. These external ridges serve as effective radiators for conducting heat away from the walls of the tube 12. The thermally conductive walls absorb heat by radiation and convection from the components 38 and circuit elements on the boards 40. Thus, the assembly serves as a heat sink to remove excess heat from the active electronic components. At the same time, the closed holder effectively maintains the electronic members in an environment free from ambient air, dust, moisture, etc. The all metal holder serves as effective shield for the electronic members inside against external electromagnetic radiation fields, thermal currents, and changes in air temperature and humidity. This stable environment in holder 10 prolongs the useful lives of the electronic members inside the holder. The holder is so constructed that it can readily be opened to service the circuit boards and components inside the holder. The boards and components can be easily inserted and removed. To improve the sealing of the closed compartment 100 inside the holder, sealing gaskets 102 may be provided between the end faces 22 and the cover plates 44. If desired the cover plates 44 may have external parallel ridges 104 defining grooves to radiate heat.

The tube 12 can be made by well known extrusion machinery and processes for extruding aluminum tube. The cover plates 44 may be struck or punched out of flat sheets of aluminum or plastic molded.

The tube 12 and the plates 44 are each a one-piece structure which is strong, durable, rigid, and dimensionally and structurally stable. The holder assembly can be produced economically by mass production metal working machinery and processes. If desired, the outside of the tube 12 and the cover plates may be plated to improve heat conduction.

It should be understood that the foregoing relates to only a preferred embodiment of the invention which has been by way of example only, and that it is intended to cover all changes and modifications of the example of the invention herein chosen for the purpose of the disclosure, which do not constitute departures from the spirit and scope of the invention.

What is claimed is:

1. A holder for electronic components, comprising:
    a tube open at opposite ends and having four walls integrally joined at respective corners of said tube;
    a first one of said walls having a multiplicity of parallel laterally spaced first ridges inside said tube extending between said ends of said tube, and defining between consecutive pairs of said first ridges a first groove receiving a first edge of a flat circuit board carrying circuit elements;
    a second one of said walls disposed parallel to said first wall and having a multiplicity of parallel laterally spaced second ridges inside said tube defining between consecutive pairs of said second ridges a second grooves aligned parallel with said first groove transversing said tube receiving a second edge of said board opposite from said first edge to removably support said board;
    wherein third and fourth ones of said four walls are disposed parallel to each other with each perpendicular to said first and second walls, said third and fourth walls each having a plurality of other parallel ridges inside said compartment and defining between consecutive pairs of said other parallel ridges a respective third and fourth groove extending longitudinally of said tube, said third and fourth grooves aligned with each other to support another circuit board carrying other circuit elements when said first circuit board is removed from said compartment, said other circuit board having a width different from said width of said first circuit board;
    wherein certain ones of said grooves in said first, second, third and fourth walls inside said tube are formed securing a threaded nut and wherein said certain grooves have a lateral opening through which a threaded screw is inserted to mate with the threads in said threaded nut;
    further comprising a pair of cover plates respectively closing said open opposite ends of said tube to define a closed compartment; and
    wherein said tube and said cover plates are made of a thermally conductive material and the outer sides of said first, second, third, and fourth walls are formed with a multiplicity of narrow grooves and wider grooves defined by V-shaped ridges which serve as effective radiators for conducting any heat generated in said tube out of said tube.

2. A holder for electronic components as defined in claim 1, further comprising sealing means disposed between said cover plates and said ends of said tube hermetically sealing said compartment in said tube.

3. A holder fo electronic components as defined in claim 1, wherein said corners of said tube inside said compartment receive self-tapping screws which removably holds said cover plates on said opposite ends of said tube.

4. A holder for electronic components as defined in claim 1, wherein said tube is made as a one piece extrusion to maximize rigidly and strength and to effect economy in manufacture.

5. A holder for electronic components as defined in claim 4, wherein at least one of said cover plates carries a connector block for electrically connecting external electronic circuitry to said circuit members and said circuit elements inside said compartment.

6. A holder for electronic components as defined in claim 1, wherein said cover plates have still other ridges on outer sides thereof to maximize external radiation of heat from inside said compartment.

* * * * *